US008853037B2

(12) United States Patent
Cho

(10) Patent No.: US 8,853,037 B2
(45) Date of Patent: Oct. 7, 2014

(54) METHODS FOR FABRICATING INTEGRATED CIRCUITS

(75) Inventor: Jin Cho, Palo Alto, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 386 days.

(21) Appl. No.: 13/420,412

(22) Filed: Mar. 14, 2012

(65) Prior Publication Data

US 2013/0244387 A1  Sep. 19, 2013

(51) Int. Cl.
*H01L 21/336* (2006.01)
*H01L 21/8234* (2006.01)
*H01L 21/8238* (2006.01)
*H01L 29/66* (2006.01)
*H01L 29/78* (2006.01)

(52) U.S. Cl.
CPC ... *H01L 21/823431* (2013.01); *H01L 29/66795* (2013.01); *H01L 29/785* (2013.01); *H01L 21/823821* (2013.01); *H01L 29/7848* (2013.01)
USPC ............... 438/300; 438/285; 257/E21.619; 257/E21.634

(58) Field of Classification Search
CPC .............. H01L 21/823431; H01L 21/823821; H01L 21/76224; H01L 29/785; H01L 29/66795; H01L 29/7848
USPC ............ 438/300, 285; 257/E21.619, E21.634
See application file for complete search history.

(56) References Cited

U.S. PATENT DOCUMENTS

| 7,601,592 | B2 * | 10/2009 | Oh et al. ............... 438/259 |
| 7,714,377 | B2 * | 5/2010 | Specht et al. ........... 257/316 |
| 7,838,913 | B2 * | 11/2010 | Cheng et al. ........... 257/263 |
| 8,106,464 | B2 | 1/2012 | Cho et al. |
| 8,138,031 | B2 * | 3/2012 | Yagishita ............ 438/151 |
| 8,367,498 | B2 * | 2/2013 | Chang et al. ........... 438/268 |
| 8,541,286 | B2 * | 9/2013 | Park ..................... 438/427 |
| 2005/0215014 | A1 | 9/2005 | Ahn et al. |
| 2009/0108353 | A1 | 4/2009 | Cho |
| 2010/0248454 | A1 | 9/2010 | Maszara et al. |
| 2011/0068407 | A1 * | 3/2011 | Yeh et al. ............. 257/369 |
| 2011/0198696 | A1 | 8/2011 | Choi et al. |
| 2011/0237046 | A1 | 9/2011 | Maszara et al. |
| 2011/0263094 | A1 | 10/2011 | Lin et al. |
| 2012/0104472 | A1 * | 5/2012 | Xu et al. ............... 257/288 |
| 2013/0217204 | A1 * | 8/2013 | Park ..................... 438/424 |

* cited by examiner

*Primary Examiner* — Mary Wilczewski
(74) *Attorney, Agent, or Firm* — Ingrassia Fisher & Lorenz, P.C.

(57) ABSTRACT

Methods are provided for forming semiconductor devices. One method includes forming a first layer overlying a bulk semiconductor substrate. A second layer is formed overlying the first layer. A plurality of trenches is etched into the first and second layers. Portions of the second layer that are disposed between the plurality of trenches define a plurality of fins. A gate structure is formed overlying the plurality of fins. The first layer is etched to form gap spaces between the bulk semiconductor substrate and the plurality of fins. The plurality of fins is at least partially supported in position adjacent to the gap spaces by the gate structure. The gap spaces are filled with an insulating material.

20 Claims, 9 Drawing Sheets

METHODS FOR FABRICATING INTEGRATED CIRCUITS

TECHNICAL FIELD

The present invention relates generally to methods for fabricating integrated circuits, and more particularly relates to methods for fabricating integrated circuits with FINFETs using bulk semiconductor substrates.

BACKGROUND

Transistors such as metal oxide semiconductor field effect transistors (MOSFETs) or simply field effect transistors (FETs) or MOS transistors are the core building blocks of the vast majority of semiconductor integrated circuits (ICs). A FET includes source and drain regions between which a current can flow through a channel under the influence of a bias applied to a gate electrode that overlies the channel. Some semiconductor ICs, such as high performance microprocessors, can include millions of FETs. For such ICs, decreasing transistor size and thus increasing transistor density has traditionally been a high priority in the semiconductor manufacturing industry. Transistor performance, however, must be maintained even as the transistor size decreases.

A FINFET is a type of transistor that lends itself to the dual goals of reducing transistor size while maintaining transistor performance. The FINFET is a three dimensional transistor formed in a thin fin that extends upwardly from a semiconductor substrate. Transistor performance, often measured by its transconductance, is proportional to the width of the transistor channel. In a FINFET, the transistor channel is formed at least along the vertical sidewalls of the fin, so a wide channel, and hence high performance, can be achieved without substantially increasing the area of the substrate surface required by the transistor.

FINFETs have historically been formed using silicon-on-isolator (SOI) substrates. A SOI substrate includes a silicon material layer overlying an insulator layer, such as a silicon oxide layer. Using the SOI substrate, the conductive fins are formed from the silicon material layer while the insulator layer provides clear demarcation of the base of the fins to electrically isolate the FINFETs. Electrical isolation, e.g., between source and drain regions of FINFETs and/or between adjacent FINFETs, is important for reducing or minimizing electrical current leakage which is a parasitic effect that degrades performance of the integrated circuit.

Bulk semiconductor substrates, such as bulk silicon substrates, are less expensive than SOI substrates, and FINFETs can also be fabricated using bulk semiconductor substrates. A bulk semiconductor substrate is, for example, a monolithic block of single crystal silicon. When a bulk semiconductor substrate is used to fabricate FINFETs, there is no inherent isolation layer and thus no clear demarcation of the base of the fins to electrically isolate the FINFETs. Therefore, an isolation methodology is needed to reduce or minimize electrical current leakage, e.g., between source and drain regions of FINFETs and/or between adjacent FINFETs. Unfortunately, conventional isolation methodologies for FINFETs that are formed using bulk semiconductor substrates are complex, inherently difficult to control, and/or require uniform thickness of the fins.

Accordingly, it is desirable to provide methods for fabricating an integrated circuit with FINFETs using a bulk semiconductor substrate in which the FINFETs are electrically isolated to reduce or minimize current leakage. Moreover, it is desirable to provide methods for fabricating an integrated circuit with FINFETs using a bulk semiconductor substrate and which include improved isolation methodologies for the FINFETs. Furthermore, other desirable features and characteristics of the present invention will become apparent from the subsequent detailed description and the appended claims, taken in conjunction with the accompanying drawings and the foregoing technical field and background.

BRIEF SUMMARY

Methods for fabricating integrated circuits are provided herein. In accordance with an exemplary embodiment, a method for fabricating an integrated circuit includes forming a first layer of a first semiconductor material overlying a bulk semiconductor substrate that is formed of a second semiconductor material. A second layer of a third semiconductor material is formed overlying the first layer. A plurality of trenches is etched into the first and second layers. Portions of the second layer that are disposed between the plurality of trenches define a plurality of fins. A gate structure is formed overlying the plurality of fins. The first layer is etched to form gap spaces between the bulk semiconductor substrate and the plurality of fins. The plurality of fins is at least partially supported in position adjacent to the gap spaces by the gate structure. The gap spaces are filled with an insulating material.

In accordance with another exemplary embodiment, a method for fabricating an integrated circuit is provided. The method includes forming a first layer of a first semiconductor material overlying a bulk semiconductor substrate that is formed of a second semiconductor material. A second layer of a third semiconductor material is formed overlying the first layer. A plurality of trenches is etched through the first and second layers into the bulk semiconductor substrate. Portions of the second layer that are disposed between the plurality of trenches define a plurality of fins. The plurality of trenches is filled with an oxide material. An upper portion of the oxide material is removed to form an oxide layer that is disposed in lower portions of the plurality of trenches. A gate structure is formed overlying the plurality of fins and the oxide layer. The first layer is etched to form gap spaces between the bulk semiconductor substrate and the plurality of fins. The plurality of fins is at least partially supported in position adjacent to the gap spaces by the gate structure. The gap spaces are filled with an insulating material.

In accordance with another exemplary embodiment, a method for fabricating an integrated circuit is provided. The method includes epitaxially growing a first layer of silicon germanium overlying a bulk silicon substrate. A second layer of silicon is epitaxially grown overlying the first layer. A plurality of trenches is etched through the first and second layers into the bulk silicon substrate. Portions of the second layer that are disposed between the plurality of trenches define a plurality of fins. An oxide material is deposited to fill the plurality of trenches. An upper portion of the oxide material is removed using a CMP process, an etching process, or a combination thereof to form an oxide layer that is disposed in lower portions of the plurality of trenches. A gate structure is formed overlying the plurality of fins and the oxide layer. The first layer is etched to form gap spaces between the bulk silicon substrate and the plurality of fins. The plurality of fins is at least partially supported in position adjacent to the gap spaces by the gate structure. Silicon oxide or silicon nitride is deposited and etched to fill the gap spaces.

BRIEF DESCRIPTION OF THE DRAWINGS

The present invention will hereinafter be described in conjunction with the following drawing figures, wherein like numerals denote like elements.

FIGS. 2-10 illustrate the integrated circuit in cross sectional view during various stages of its fabrication. FIGS. 11-14 illustrate the integrated circuit in perspective view during various later stages of its fabrication in accordance with an exemplary embodiment. FIGS. 15-18 illustrate the integrated circuit in perspective view during various later stages of its fabrication in accordance with another exemplary embodiment.

DETAILED DESCRIPTION

The following Detailed Description is merely exemplary in nature and is not intended to limit the invention or the application and uses of the invention. Furthermore, there is no intention to be bound by any theory presented in the preceding background or the following detailed description.

Integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term used herein refers to any device that includes a conductive gate electrode (whether metal or other conductive material) that is positioned over a gate insulator (whether oxide or other insulator) which, in turn, is positioned over a semiconductor substrate. One type of MOS transistor used in the design of ICs is a FINFET, which can be fabricated as a P-channel transistor or as a N-channel transistor, and can also be fabricated with or without mobility enhancing stress features. A circuit designer can mix and match device types, using P-channel and N-channel, FINFET and other types of MOS transistors, stressed and unstressed, to take advantage of the best characteristics of each device type as they best suit the circuit being designed.

Figure 1:
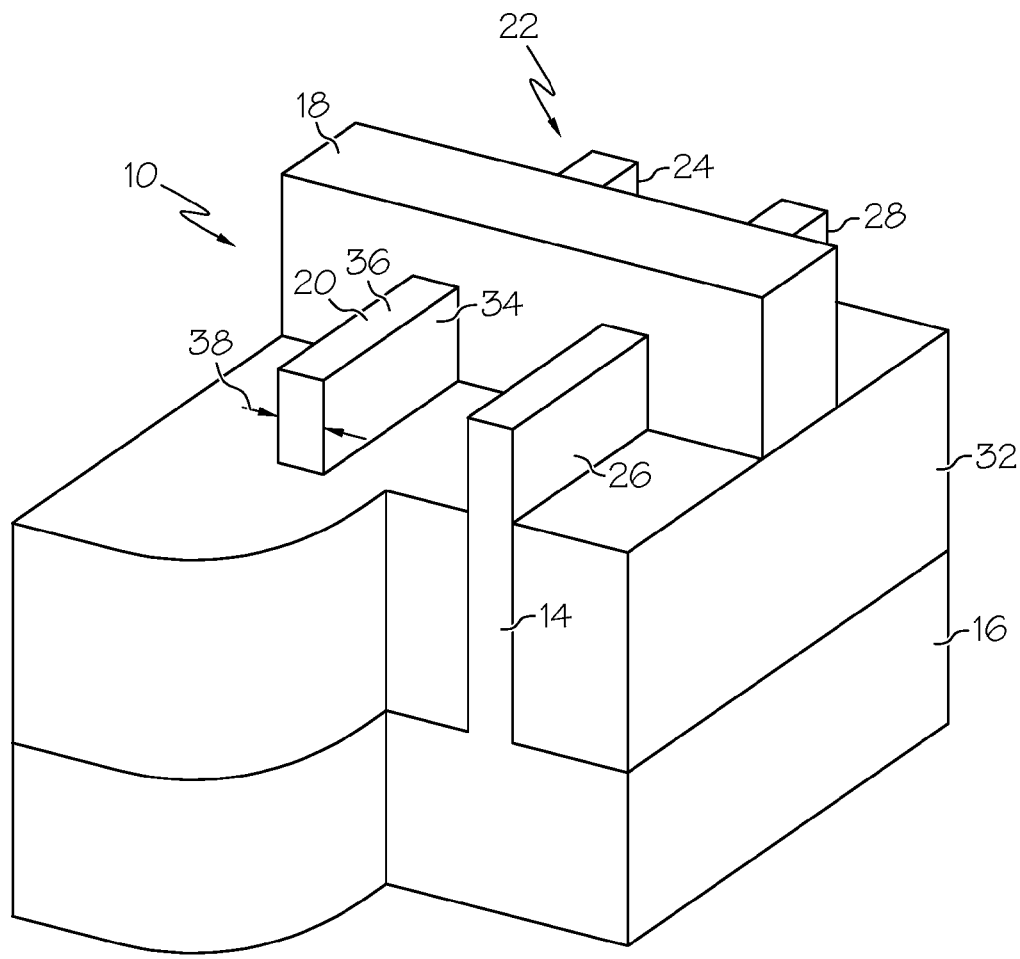
FIG. 1 illustrates a FINFET in a partially cut away perspective view.

The following brief explanation is provided to identify some of the unique features of FINFETs. FIG. 1 illustrates, in a cut away perspective view, a portion of a FINFET integrated circuits (IC) 10. As illustrated, the IC 10 includes two fins 12 and 14 that are formed from and extend upwardly from a bulk semiconductor substrate 16. A gate electrode 18 overlies the two fins 12 and 14 and is electrically insulated from the fins 12 and 14 by a gate insulator (not illustrated). An end 20 of the fin 12 is appropriately impurity doped to form a source of a FINFET 22, and an end 24 of the fin 12 is appropriately impurity doped to form a drain of the FINFET 22. Similarly, the ends 26 and 28 of the fin 14 form the source and drain, respectively, of another FINFET 30.

The illustrated portion of IC 10 thus includes two FINFETs 22 and 30 having a common gate electrode 18. In another configuration, if the ends 20 and 26 that form the sources are electrically coupled together and the ends 24 and 28 that form the drains are electrically coupled together, the structure would be a two-fin FINFET having twice the gate width of either FINFET 22 or 30. An oxide layer 32 forms electrical isolation between the fins 12 and 14 and between adjacent devices as is needed for the circuit being implemented. The channel of the FINFET 22 extends along a sidewall 34 of the fin 12 beneath the gate electrode 18, along a top 36 of the fin 12, as well as along an opposite sidewall not visible in this perspective view. The advantage of the FINFET structure is that although the fin 12 has only the narrow width represented by the arrows 38, the channel has a width represented by at least twice the height of the fin 12 above the oxide layer 32. The channel width thus can be much greater than fin width.

FIGS. 2-18 illustrate methods for forming an IC 40 in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portion of the IC 40 at later stages of fabrication, as shown in FIGS. 11-18, includes only two FINFETs 42 and 44, although those of skill in the art will recognize that an actual IC could include a large number of such transistors. FINFETs 42 and 44 are similar to FINFETs 22 and 30 described above with at least the exception, among others, that the FINFETs 42 and 44 have a clear demarcation of the base 92 of their fins 88 and 90 (see FIGS. 13-14 and 17) with an underlying isolation layer as will be described in further detail below to enhance electrical isolation and to reduce or minimize current leakage. Various steps in the manufacture of ICs are well known and so, in the interest of brevity, many conventional steps will only be mentioned briefly herein or will be omitted entirely without providing the well known process details.

Figure 2:
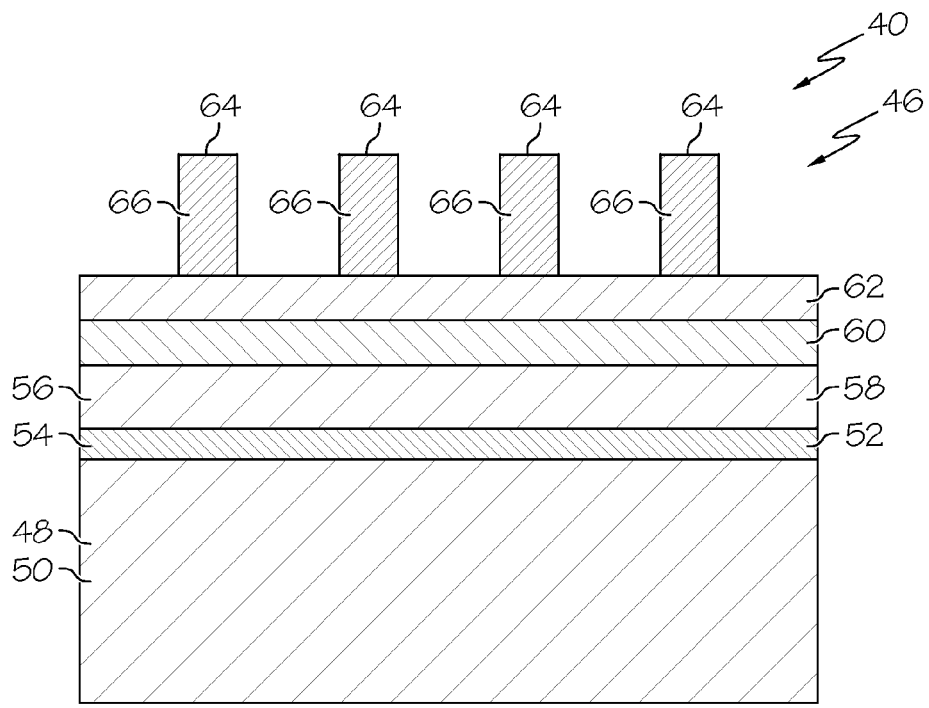
FIGS. 2-18 illustrate methods for fabricating integrated circuits in accordance with various embodiments.
Figure 3:
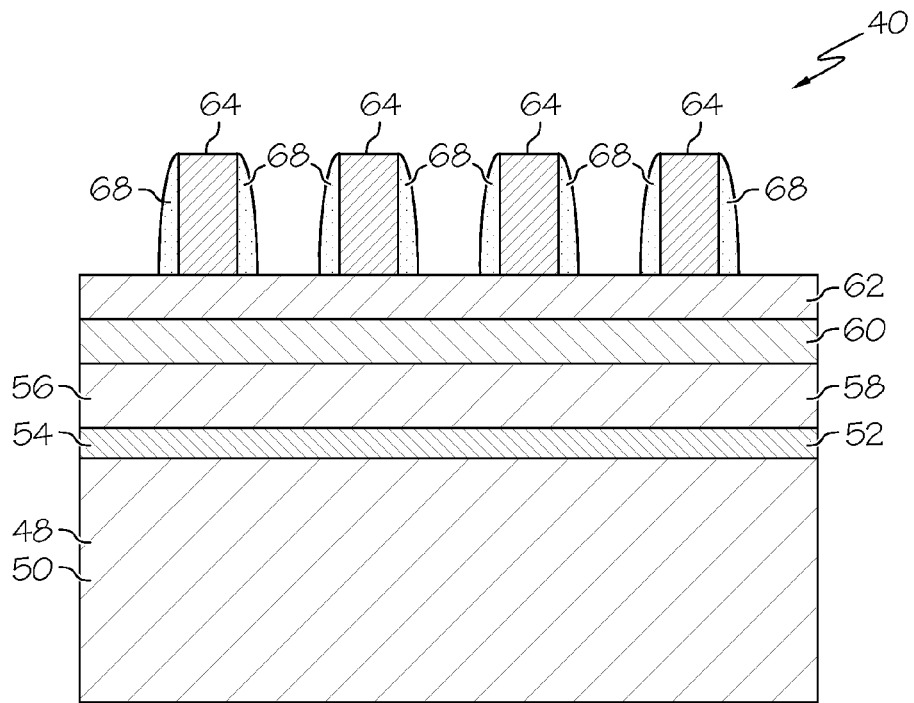
Figure 4:
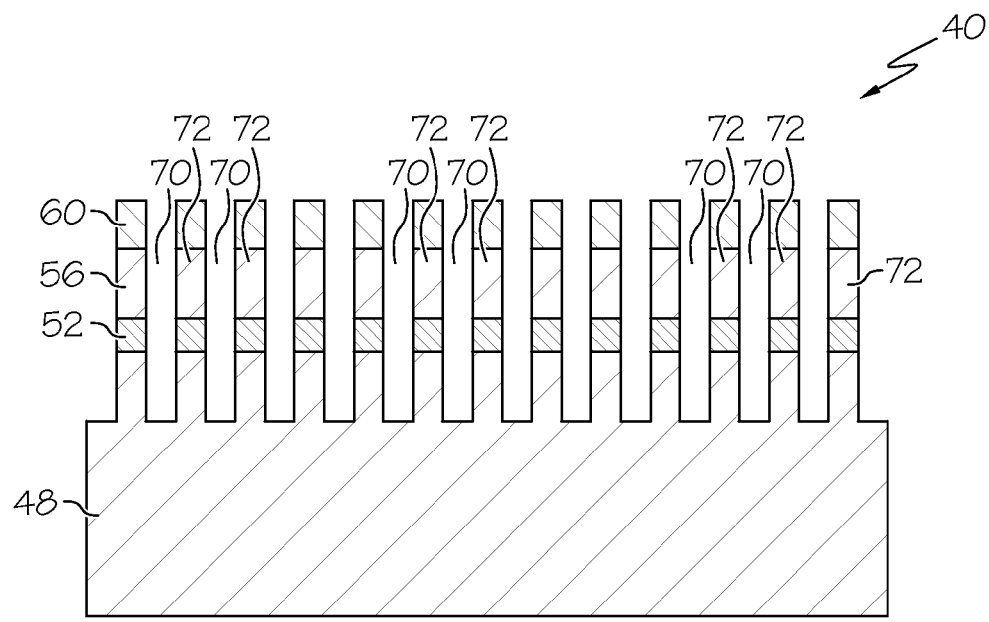
Figure 5:
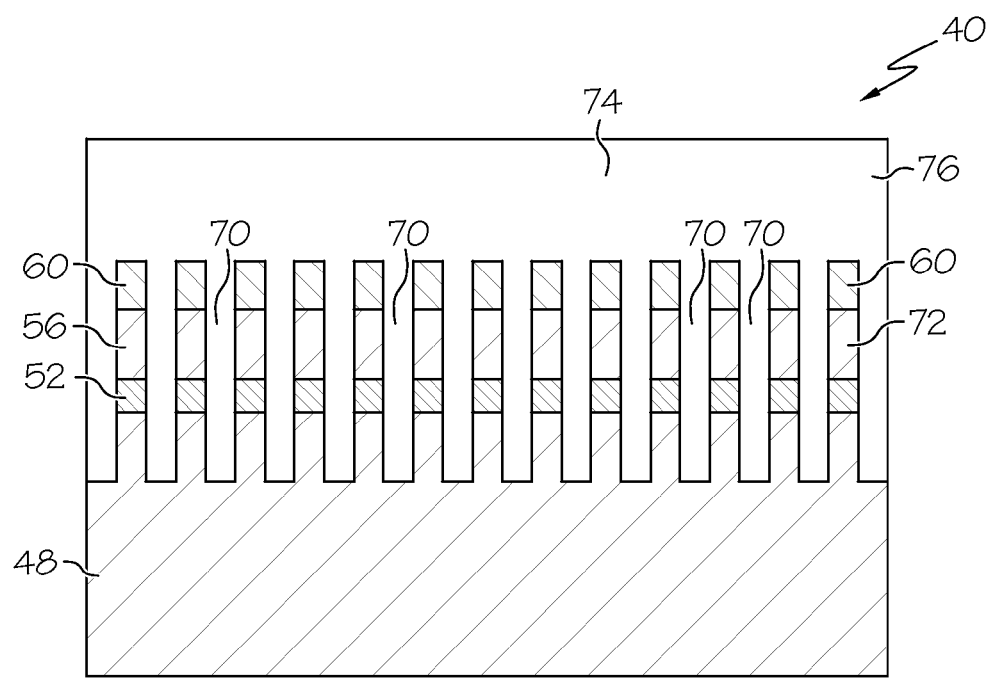
Figure 6:
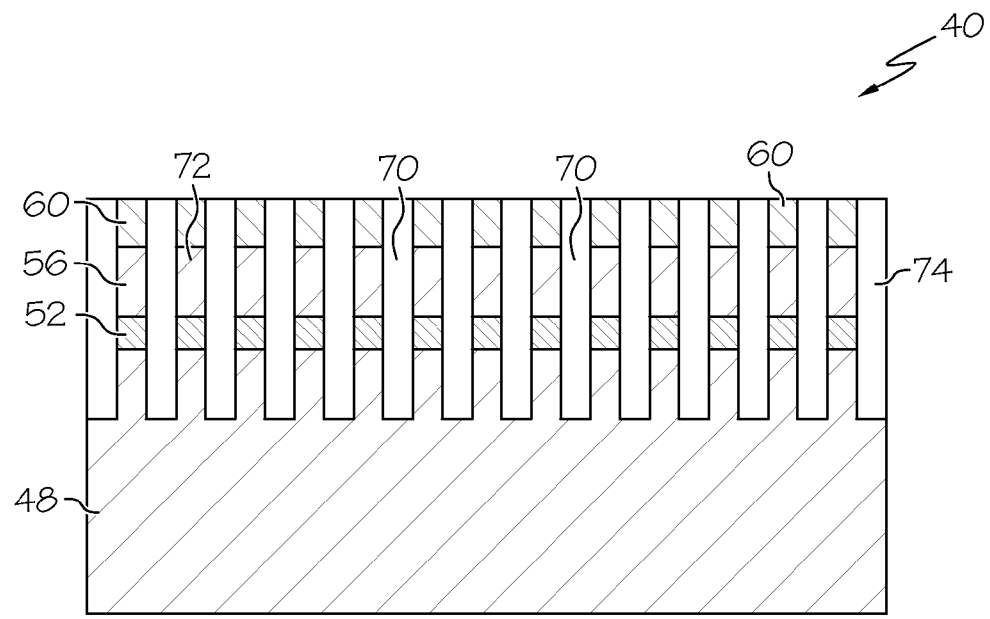

FIGS. 2-3 illustrate, in cross sectional views, a portion of the IC 40 at early fabrication stages in accordance with an exemplary embodiment. The illustrated portion includes a device area 46 in which FINFETs such as FINFETs 42 and 44 (see FIGS. 11-18) will be fabricated. The IC 40 is fabricated on a bulk semiconductor substrate 48 that is formed of a semiconductor material 50. In an exemplary embodiment, the bulk semiconductor substrate 48 is a bulk silicon substrate and the semiconductor material 50 includes silicon. For example, the bulk silicon substrate can be formed from relatively pure silicon, silicon admixed with germanium or carbon, or silicon admixed with some other semiconductor material(s) commonly used in the fabrication of integrated circuits. Alternatively, the semiconductor material 50 of the bulk semiconductor substrate 48 can be germanium, gallium arsenide, or the like. The semiconductor material 50 need not be doped, although it may be very lightly doped as either N-type or P-type, without impacting the manufacturing process described herein.

A first layer 52 of a semiconductor material 54, such as silicon germanium, is formed overlying the bulk semiconductor substrate 48. In an exemplary embodiment, the first layer 52 is formed by epitaxially growing silicon germanium on the bulk semiconductor substrate 48 in accordance with known process techniques. In one example, the first layer 52 is formed by epitaxially growing silicon germanium that contains of from about 30 to about 60 weight percent of germanium. In an exemplary embodiment, the first layer 52 has a thickness of from about 250 to about 750 Å. A second layer 56 of a semiconductor material 58, such as a silicon-containing material, is formed overlying the first, layer 52. In an exemplary embodiment, the second layer 56 is formed by epitaxially growing silicon on the first layer 52 in accordance with known process techniques. In one example, the second layer 56 is formed by epitaxially growing substantially pure silicon to form the second layer 56 having a thickness of from about 2,000 to about 3,000 Å. As will be discussed in further detail below, the second layer 56 is used to form the fins) that define the FINFETs 42 and 44 of the IC 40.

The process continues by forming a hard mask layer 60 overlying the second layer 56, and an oxide layer 62 overlying the hard mask layer 60. In an exemplary embodiment, the hard mask layer 60 is formed by depositing silicon nitride on the second layer 56, and the oxide layer 62 is formed by depositing silicon oxide on the hard mask layer 60. Well known process techniques, such as chemical vapor deposition (CVD) and/or the like, may be used to form the hard mask layer 60 and the oxide layer 62.

As illustrated, a plurality of STI stacks 64 is formed spaced apart on the oxide layer 62 using well known process techniques, such as depositing, patterning, and etching a semiconductor material 66, e.g., polysilicon or the like. Next, sidewall spacers 68 are formed on the STI stacks 64 by depositing a nitride layer overlying the STI stacks 64 and anisotropically etching the nitride layer.

FIGS. 4-7 illustrate, in cross sectional views, the IC 40 at further advanced fabrication stages in accordance with an exemplary embodiment. A plurality of trenches 70 is formed through the hard mask layer 60, the first and second layers 52 and 56, and into the bulk semiconductor substrate 48. In an exemplary embodiment, the plurality of trenches 70 is formed by removing the STI stacks 64, e.g., using a selective etching process, and anisotropically etching through the oxide layer 62, the hard mask layer 60, the first and second layers 52 and 56, and into the bulk semiconductor substrate 48 using the sidewall spacers 68 as an etch mask. The sidewall spacers 68 and the oxide layer 62 are then removed to expose the hard mask layer 60. As illustrated, the portions of the second layer 56 that are disposed between the plurality of trenches 70 define a plurality of fins 72.

Figure 7:
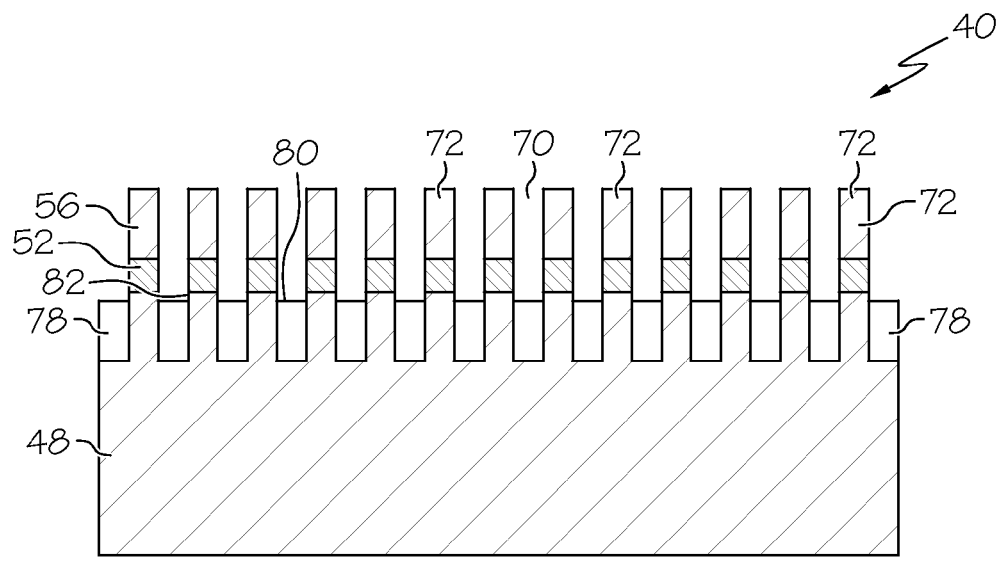

An oxide material 74, such as silicon oxide, is deposited to fill the plurality of trenches 70 and cover the hard mask layer 60. The plurality of trenches 70 may be filled with the oxide material 74 using a CVD process, flowable oxide deposition process, spin on glass process, or any other deposition process known to those skilled in the art. An excess upper portion 76 of the oxide material 74 that overlies the hard mask layer 60 is then removed via CMP or the like. The process continues by removing the hard mask layer 60 and then removing a remaining upper portion of the oxide material 74 to expose the plurality of fins 72 and form an oxide layer 78 that is disposed in lower portions of the plurality of trenches 70 as shown in FIG. 7. Well known process techniques, such as wet etching, dry etching such as RIE, and/or the like, may be used to remove the hard mask layer 60 and the upper portion of the oxide material 74. In an exemplary embodiment, an uppermost portion 80 of the oxide layer 78 is disposed below a lower-most portion 82 of the first layer 52.

Figure 8:
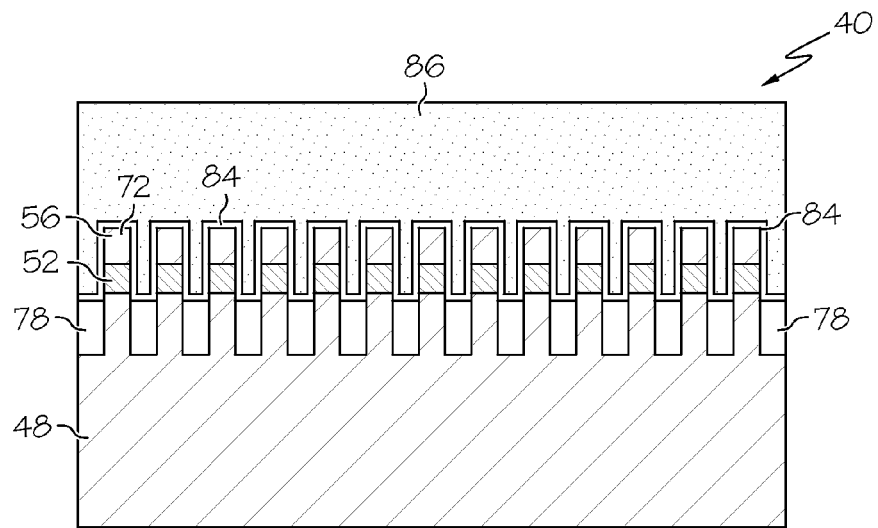
Figure 9:
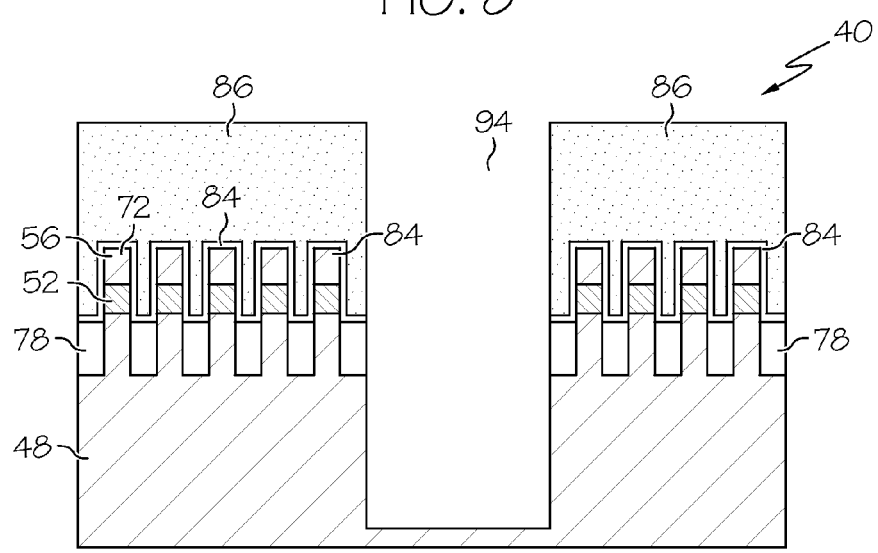
Figure 10:
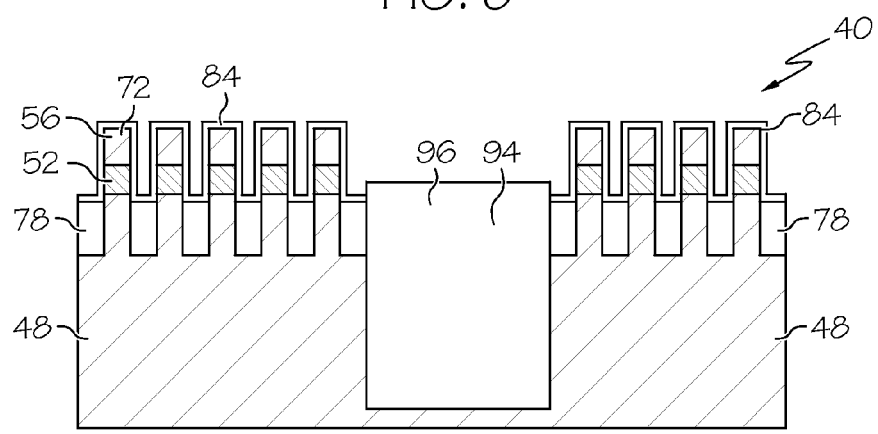

FIGS. 8-10 illustrate, in cross sectional views, the IC 40 at further advanced fabrication stages in accordance with an exemplary embodiment. A dummy oxide layer 84, such as silicon oxide, is deposited overlying the plurality of fins 72, and a nitride hard mask layer 86 is deposited overlying the dummy oxide layer 84. A STI trench 94 is etched through the dummy oxide and nitride hard mask layers 84 and 86 and into the bulk semiconductor substrate 48. The dummy oxide layer 84, the nitride hard mask layer 86, and the STI trench 94 may be formed in accordance with well known process techniques, such as CVD and selective wet or dry etching. An STI fill material 96, e.g., an oxide material such as silicon oxide, is deposited to fill the STI trench 94, and an excess portion of the STI fill material 96 overlying the nitride hard mask layer 86 may be removed by CMP or the like. The nitride hard mask layer 86 is then removed as illustrated in FIG. 10.

Figure 11:
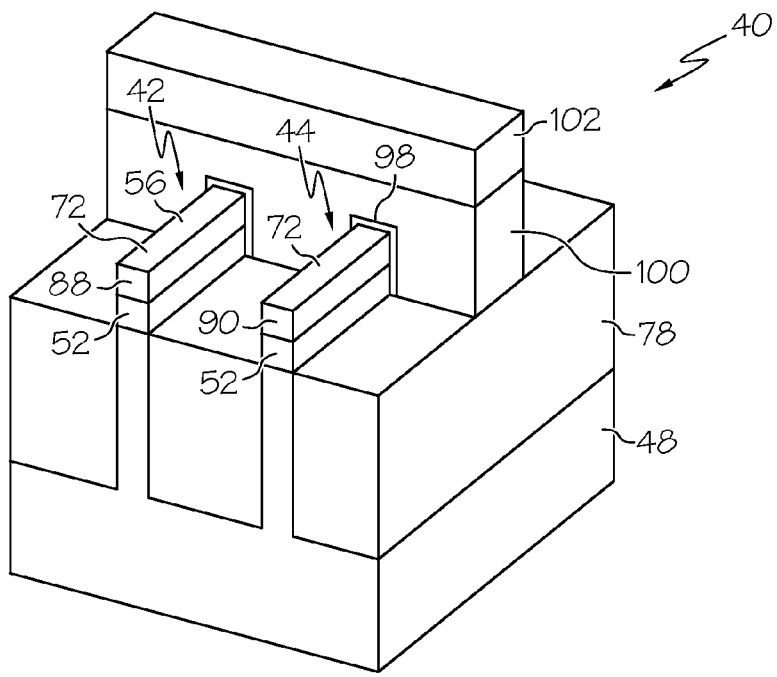

FIG. 11 illustrates, in perspective view, the IC 40 at a further advanced fabrication stage in accordance with an exemplary embodiment. An insulating layer 98 is formed overlying fins 88 and 90 of the plurality of fins 72 by removing the dummy oxide layer 84 and then depositing and selectively etching a dielectric material, such as silicon oxide, silicon nitride, or the like. Alternatively, the insulating layer 98 may be formed by selectively etching the dummy oxide layer 84. Using well known process techniques, a gate electrode structure 100 is formed orthogonal to and overlying the fins 88 and 90 and also overlying the oxide layer 78. The gate electrode structure 100 may be formed of polysilicon or other gate electrode forming material known to those skilled in the art. A nitride cap 102 is then formed overlying an upper portion of the gate electrode structure 100.

Figure 12:
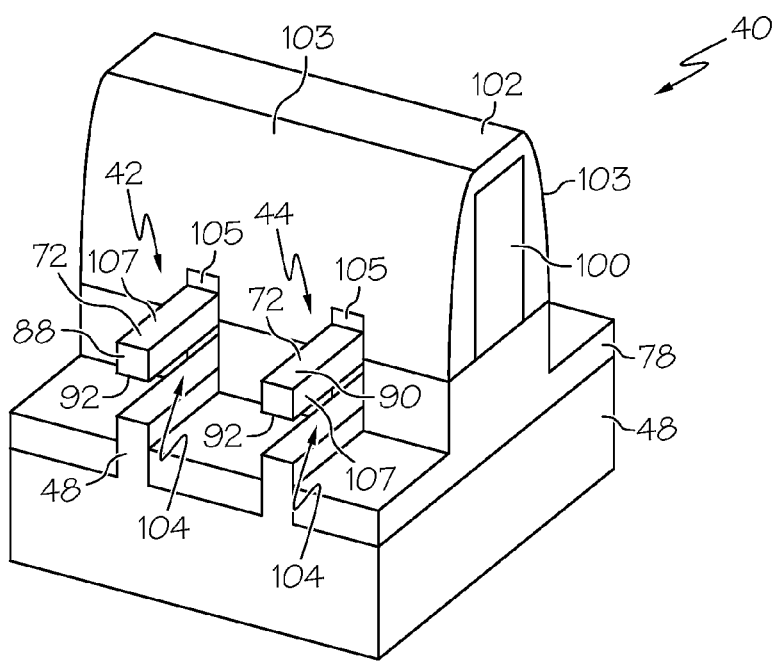

FIG. 12 illustrates, in perspective view, the IC 40 at a further advanced fabrication stage in accordance with an exemplary embodiment. Sidewall spacers 103 are formed on sides of the gate electrode structure 100 by depositing a nitride layer overlying the gate electrode structure 100 and anisotropically etching the nitride layer. As illustrated, the sidewall spacers 103, the gate electrode structure 100, and the nitride cap 102 cover intermediate sections 105 of the fins 88 and 90 while exposed outer sections 107 of the fins 88 and 90 extending outwardly from the intermediate sections 105 are not covered.

In an exemplary embodiment, using the nitride cap 102 and the sidewall spacers 103 to protect the gate electrode structure 100, the first layer 52 is removed via etching to form gap spaces 104 between the bulk semiconductor substrate 48 and the fins 88 and 90. In particular and as shown, the gap spaces 104 extend underneath the exposed outer sections 107 and the intermediate sections 105 of the fins 88 and 90 and form a clear boundary space between the base 92 of the fins 88 and 90 and the bulk semiconductor substrate 48. The fins 88 and 90, which are suspended over or adjacent to the gap spaces 104, are supported in position by the gate electrode structure 100 and additionally, by the sidewall spacers 103. In an exemplary embodiment, the first layer 52 is etched using an etchant that etches the SiGe material of the first layer 52 in preference to the silicon material of the bulk semiconductor substrate 48 and the fins 88 and 90, such as a standard clean 2 solution (SC-2) that includes deionized water, hydrochloric acid, and hydrogen peroxide as is well known in the art. Other etchants known to those skilled in the art may also be used to remove the first layer 52. As illustrated, the etching process may also partially etch and remove upper portions of the exposed outer sections 107 of the fins 88 and 90 and/or the oxide layer 78.

Figure 13:
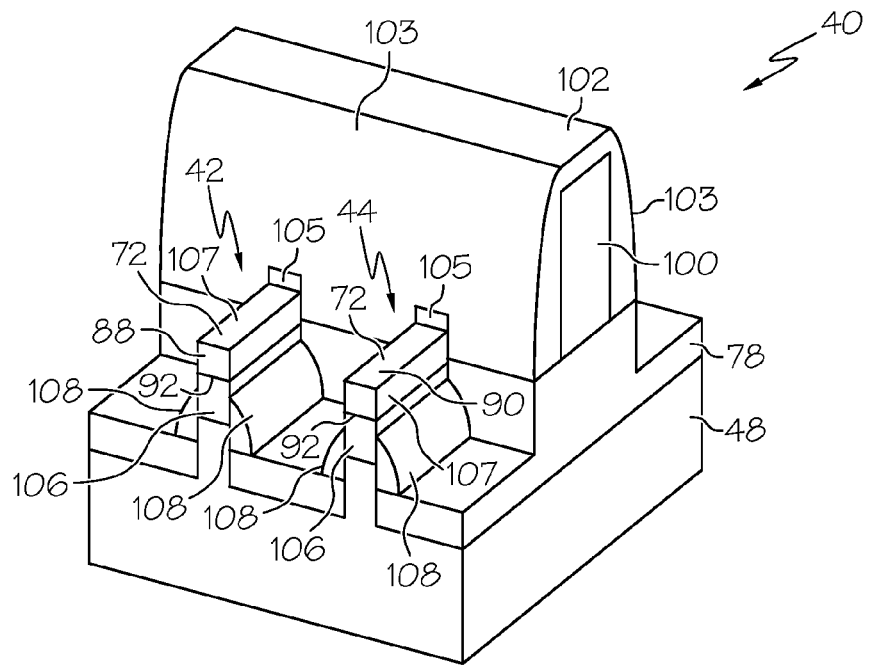
Figure 14:
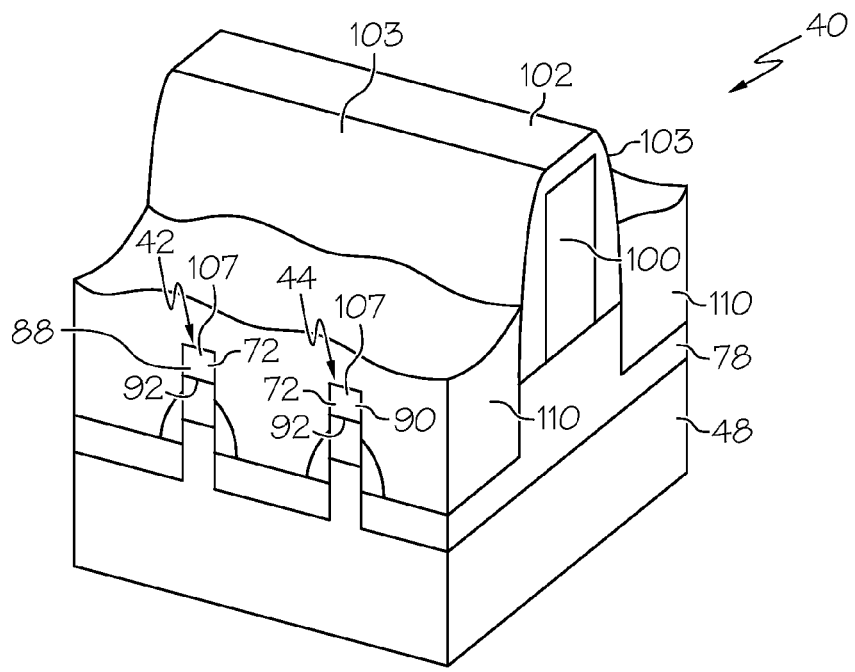

FIGS. 13-14 illustrate, in perspective views, the IC 40 at further advanced fabrication stages in accordance with an exemplary embodiment. An insulating material 106, such as silicon oxide, silicon nitride, or other dielectric material known to those skilled in the art, is deposited to fill the gap spaces 104. In particular, the insulating material 106 fills in the clear boundary space between the base 92 of the fins 88 and 90 and the bulk semiconductor substrate 48, providing a clear demarcation of the base 92 of the fins 88 and 90 to electrically isolate the FINFETs 42 and 44 and reduce or minimize electrical current leakage. In an exemplary embodiment, the gap spaces 104 are filled with the insulating material 106 using a CVD process, flowable oxide deposition process, spin on glass process, or other known deposition process, and the insulating material 106 is blanket etched such that the insulating material 106 is disposed primarily or only in the gap spaces 104 directly under the fins 88 and 90 as illustrated in FIG. 13. Optionally, sidewall spacers 108 of a dielectric material may be formed along the insulating material 106 that is disposed under the exposed outer sections 107 of the fins 88 and 92 to enhance isolation between the fins 88 and 90. As illustrated in FIG. 14, a doped layer 110 of conductivity determining doped silicon is formed overlying the oxide layer 78 and the exposed outer sections 107 of the fins 88 and 90. In an exemplary embodiment, if the FINFETs 42 and 44 are N-type FINFETs, then the doped layer 110 includes n-type doping, such as arsenic or phosphorus ions, and if the FINFETs 42 and 44 are P-type FINFETs, then the doped layer 110 includes p-type doping, such as boron ions.

Figure 15:
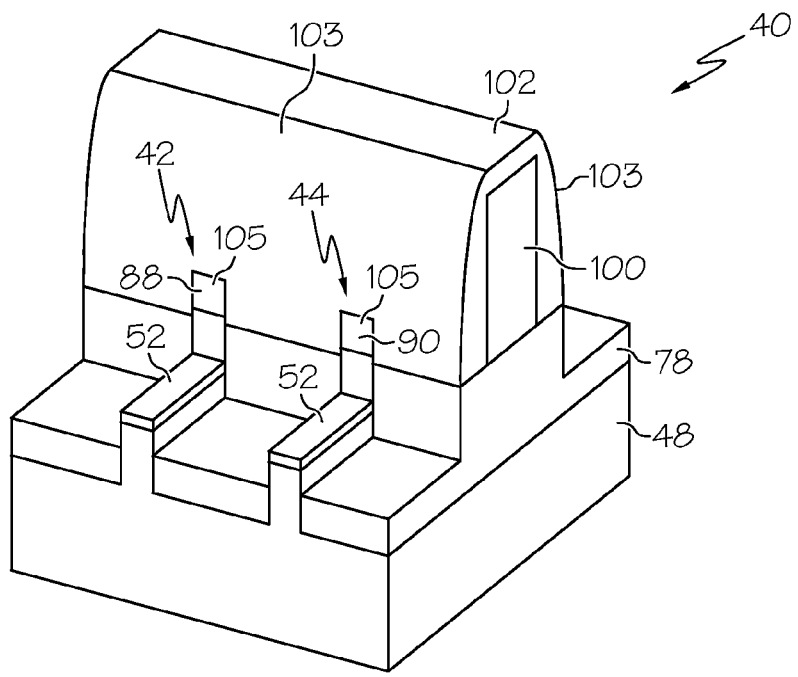
Figure 16:
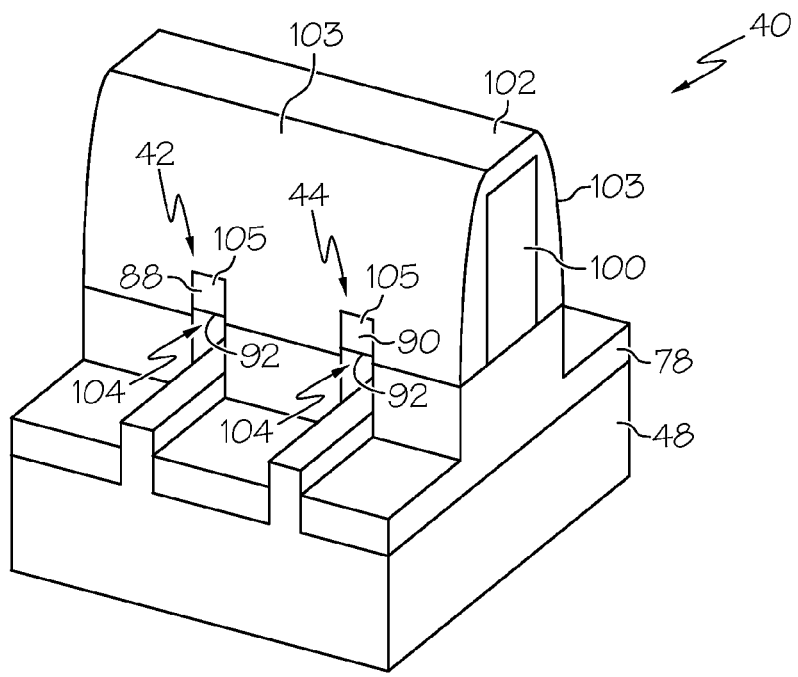
Figure 17:
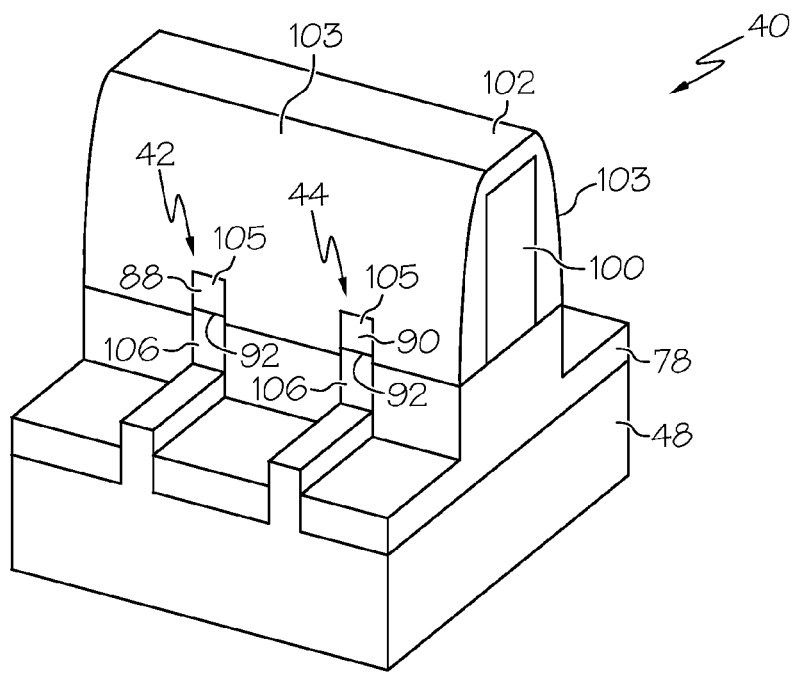
Figure 18:
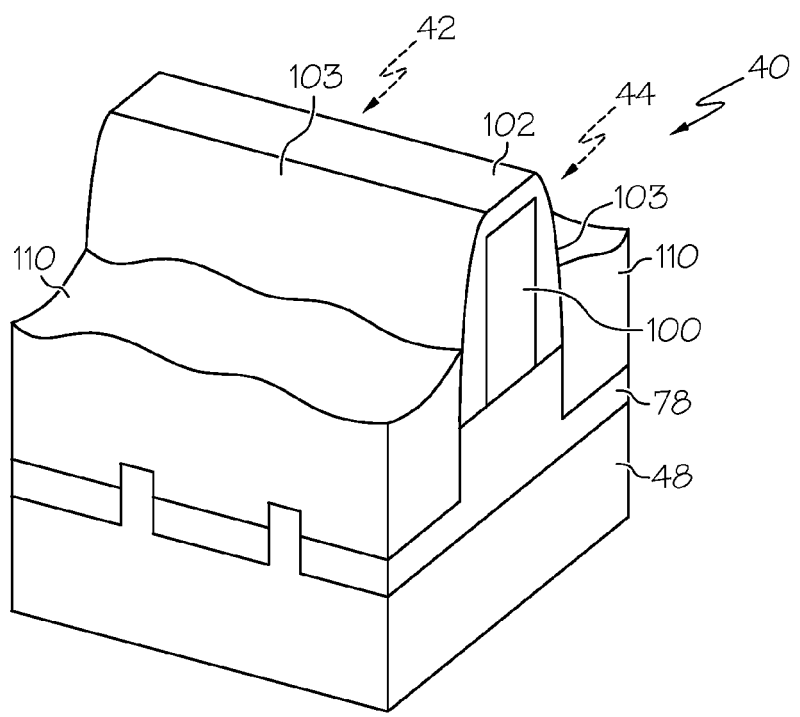

FIGS. 15-18 illustrate, in perspective views, an alternative embodiment of the IC 40 at further advanced fabrication stages following the fabrication stage illustrated in FIG. 11. As discussed above, the sidewall spacers 103 are formed on sides of the gate electrode structure 100. Using the nitride cap 102 and the sidewall spacers 103 to protect the gate electrode structure 100, the exposed outer sections 107 (see FIG. 11) of the fins 88 and 90 and the first layer 52 are removed using one or more etching processes such as RIE or the like, either concurrently or sequentially, to remove the exposed outer sections 107. The first layer 52 is etched using an etchant that etches the SiGe material of the first layer 52 in preference to the silicon material of the bulk semiconductor substrate 48 and the fins 88 and 90, such as a standard clean 2 solution (SC-2) that includes deionized water, hydrochloric acid, and hydrogen peroxide as is well known in the art. These RIE and SC-2 processes form the gap spaces 104 between the bulk semiconductor substrate 48 and the intermediate sections 105 of the fins 88 and 90. As illustrated, the gap spaces 104 form a clear boundary space between the base 92 of the fins 88 and 90 and the bulk semiconductor substrate 48. The fins 88 and 90, which are suspended over or adjacent to the gap spaces 104, are supported in position by the gate electrode structure 100 and additionally, by the sidewall spacers 103. The etching process(es) may also partially etch and remove the upper portion of the oxide layer 78 as illustrated in FIGS. 15-16.

The process continues as discussed above by depositing and etching the insulating material 106 to fill the gap spaces 104. In particular, the insulating material 106 fills in the clear boundary space between the base 92 of the fins 88 and 90 and the bulk semiconductor substrate 48, providing a clear demarcation of the base 92 of the fins 88 and 90 to electrically isolate the FINFETs 42 and 44 and reduce or minimize electrical current leakage. The doped layer 110 of conductivity determining doped silicon is formed overlying the oxide layer 78.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an integrated circuit comprising:
   forming a first layer of a first semiconductor material overlying a bulk semiconductor substrate that is formed of a second semiconductor material;
   forming a second layer of a third semiconductor material overlying the first layer;
   etching a plurality of trenches into the first and second layers, wherein portions of the second layer disposed between the plurality of trenches define a plurality of fins;
   forming a gate structure overlying the plurality of fins;
   etching the first layer to form gap spaces between the bulk semiconductor substrate and the plurality of fins, wherein the plurality of fins are at least partially supported in position adjacent to the gap spaces by the gate structure; and
   filling the gap spaces with an insulating material.

2. The method of claim 1, wherein forming the first layer comprises forming the first layer on the bulk semiconductor substrate of the second semiconductor material that comprises silicon.

3. The method of claim 1, wherein forming the first layer comprises forming the first layer of the first semiconductor material that comprises silicon germanium.

4. The method of claim 1, wherein forming the second layer comprises forming the second layer of the third semiconductor material that comprises silicon.

5. The method of claim 1, wherein filling the gap spaces comprises filling the gap spaces with the insulating material that comprises silicon oxide or silicon nitride.

6. The method of claim 1, wherein etching the plurality of trenches comprises etching through the first and second layers into the bulk semiconductor substrate to form the plurality of trenches.

7. The method of claim 1, further comprising:
   filling the plurality of trenches with an oxide material; and
   removing an upper portion of the oxide material to form an oxide layer disposed in lower portions of the plurality of trenches, and wherein forming the gate structure comprises forming the gate structure overlying the oxide layer.

8. The method of claim 7, wherein removing the upper portion of the oxide material comprises forming the oxide layer such that an upper-most portion of the oxide layer is below a lower-most portion of the first layer.

9. The method of claim 7, further comprising:
   forming a nitride cap overlying the gate structure; and
   forming sidewall spacers along sides of the gate structure, and wherein etching the first layer comprises forming the gap spaces using the nitride cap and the sidewall spacers to protect the gate structure during etching.

10. The method of claim 9, wherein etching the first layer comprises partially supporting the plurality of fins in position adjacent to the gap spaces by the sidewall spacers.

11. The method of claim 9, wherein forming the sidewall spacers comprises forming the sidewall spacers overlying intermediate sections of the plurality of fins, and wherein the plurality of fins have exposed outer sections that extend outwardly from the intermediate sections and that are disposed laterally adjacent to the sidewall spacers.

12. The method of claim 11, wherein etching the first layer comprises forming the gap spaces under the intermediate and exposed outer sections of the plurality of fins.

13. The method of claim 11, further comprising:
   removing the exposed outer sections of the plurality of fins using the nitride cap and the sidewall spacers as an etch mask.

14. The method of claim 13, wherein etching the first layer comprises forming the gap spaces under the intermediate sections of the plurality of fins after removing the exposed outer sections of the plurality of fins.

15. The method of claim 7, further comprising:
   forming a doped layer of conductivity determining doped silicon overlying the oxide layer.

16. A method for fabricating an integrated circuit comprising:
   forming a first layer of a first semiconductor material overlying a bulk semiconductor substrate that is formed of a second semiconductor material;

forming a second layer of a third semiconductor material overlying the first layer;

etching a plurality of trenches through the first and second layers into the bulk semiconductor substrate, wherein portions of the second layer disposed between the plurality of trenches define a plurality of fins;

filling the plurality of trenches with an oxide material;

removing an upper portion of the oxide material to form an oxide layer disposed in lower portions of the plurality of trenches;

forming a gate structure overlying the plurality of fins and the oxide layer;

etching the first layer to form gap spaces between the bulk semiconductor substrate and the plurality of fins, wherein the plurality of fins are at least partially supported in position adjacent to the gap spaces by the gate structure; and filling the gap spaces with an insulating material.

17. The method of claim 16, wherein removing the upper portion of the oxide material comprises forming the oxide layer using an etching process such that an upper-most portion of the oxide layer is below a lower-most portion of the first layer.

18. The method of claim 16, further comprising:

forming shallow trench isolation interposed between the plurality of fins.

19. The method of claim 18, wherein forming the shallow trench isolation comprises:

forming a dummy oxide layer overlying the plurality of fins subsequent to removing the upper portion of the oxide material;

forming a hard mask layer overlying the dummy oxide layer;

etching a STI trench through the hard mask layer, dummy oxide layer, and the oxide layer into the bulk semiconductor substrate; and depositing an STI fill material into the STI trench.

20. A method for fabricating an integrated circuits comprising:

epitaxially growing a first layer of silicon germanium overlying a bulk silicon substrate;

epitaxially growing a second layer of silicon overlying the first layer;

etching a plurality of trenches through the first and second layers into the bulk silicon substrate, wherein portions of the second layer disposed between the plurality of trenches define a plurality of fins;

depositing an oxide material to fill the plurality of trenches;

removing an upper portion of the oxide material using a CMP process, an etching process, or a combination thereof to form an oxide layer disposed in lower portions of the plurality of trenches;

forming a gate structure overlying the plurality of fins and the oxide layer;

etching the first layer to form gap spaces between the bulk silicon substrate and the plurality of fins, wherein the plurality of fins are at least partially supported in position adjacent to the gap spaces by the gate structure; and depositing and etching silicon oxide or silicon nitride to fill the gap spaces.

* * * * *